(12) United States Patent
Li

(10) Patent No.: US 10,797,264 B2
(45) Date of Patent: Oct. 6, 2020

(54) OLED PACKAGING METHOD AND OLED PACKAGING STRUCTURE

(71) Applicant: Wuhan China Star Optoelectronics Semiconductor Display Technology Co., Ltd., Wuhan, Hubei (CN)

(72) Inventor: Xiang Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 128 days.

(21) Appl. No.: 16/088,762

(22) PCT Filed: Sep. 6, 2018

(86) PCT No.: PCT/CN2018/104452
§ 371 (c)(1),
(2) Date: Sep. 26, 2018

(87) PCT Pub. No.: WO2019/153734
PCT Pub. Date: Aug. 15, 2019

(65) Prior Publication Data
US 2020/0044188 A1 Feb. 6, 2020

(30) Foreign Application Priority Data
Feb. 11, 2018 (CN) .......................... 2018 1 0143365

(51) Int. Cl.
*H01L 51/52* (2006.01)
*H01L 21/02* (2006.01)
(Continued)

(52) U.S. Cl.
CPC ...... *H01L 51/5253* (2013.01); *H01L 21/0228* (2013.01); *H01L 21/02266* (2013.01);
(Continued)

(58) Field of Classification Search
CPC . H01L 51/5253; H01L 51/0004; H01L 51/00; H01L 51/5256; H01L 51/56;
(Continued)

(56) References Cited

U.S. PATENT DOCUMENTS

2012/0248973 A1* 10/2012 Ito ........................ C09K 11/06
313/504
2016/0268547 A1 9/2016 Kim et al.
(Continued)

FOREIGN PATENT DOCUMENTS

CN 103956373 A 7/2014
CN 104078614 A 10/2014
(Continued)

*Primary Examiner* — Savitri Mulpuri
(74) *Attorney, Agent, or Firm* — Leong C. Lei

(57) ABSTRACT

An OLED packaging method and structure are disclosed. In the present invention, forming a ring-shaped organic layer on the edge of the inorganic barrier layer, and then forming a planar organic layer on the upper surface of the inorganic barrier layer surrounded by the ring-shaped organic layer. The planar organic layer and the ring-shaped organic layer are integrated together to form an organic buffering layer. The upper surface of the organic buffering layer is flat, and the region of the organic buffering layer corresponding to the edge position of the inorganic barrier layer does not have an upward projection, the film thickness and morphology of the inorganic barrier layer are not affected. The present invention can improve the barrier effect of inorganic barrier layer for water and oxygen. The upper surface of the organic buffering layer in the OLED packaging structure is flat and has a good encapsulation effect.

7 Claims, 9 Drawing Sheets

(51) Int. Cl.
  *H01L 51/00*   (2006.01)
  *H01L 51/05*   (2006.01)
  *H01L 51/56*   (2006.01)

(52) U.S. Cl.
  CPC ...... *H01L 51/0004* (2013.01); *H01L 51/0533* (2013.01); *H01L 51/56* (2013.01); *H01L 2251/301* (2013.01)

(58) Field of Classification Search
  CPC ........... H01L 21/02266; H01L 21/0228; H01L 51/0533; H01L 27/32; H01L 2251/5338; H01L 2251/301
  See application file for complete search history.

(56) References Cited

U.S. PATENT DOCUMENTS

2016/0322604 A1*  11/2016  Ho ................ H01L 51/5256
2017/0040572 A1*   2/2017  Gao ............... H01L 51/5221
2018/0233700 A1*   8/2018  Li ................. H01L 51/5246

FOREIGN PATENT DOCUMENTS

| CN | 104377222   | 2/2015 |
| CN | 108365135 A | 8/2018 |

* cited by examiner

OLED PACKAGING METHOD AND OLED PACKAGING STRUCTURE

RELATED APPLICATIONS

The present application is a National Phase of International Application Number PCT/CN2018/104452, filed Sep. 6, 2018, and claims the priority of China Application No. 201810143365.8, filed Feb. 11, 2018.

FIELD OF THE INVENTION

The present invention relates to a display technology field, and more particularly to an OLED packaging method and an OLED packaging structure.

BACKGROUND OF THE INVENTION

An Organic Light Emitting Diode (OLED) has been widely used in the field of display, lighting, and smart wearing because of good self-luminescence characteristics, high contrast, fast response, and flexible display.

The basic display principle of the OLED is that the organic material emits light through the injection and recombination of carriers under the driving of an electric field. The OLED can realize independent light emission through passing RGB pixels. A white OLED combining with color filter film or a blue OLED combining with color conversion can achieve a full color display. An OLED display technology can make the screen lighter. The self-luminous characteristics can achieve high contrast in the evening in the wild, and can be manufactured on substrates of different materials, and can be made into a flexible display.

Researches show that the composition of water vapor and oxygen in the air has a great influence on the lifetime of OLED. The reasons are mainly as follows: When OLED devices work, electrons are injected from the cathodes. This requires that the work function of the cathode metal materials is as low as possible. However, cathode metals such as aluminum, magnesium, and calcium, which have lower work functions, are generally more active and readily react with water vapor that penetrates. In addition, water vapor reacts with the hole transport layer (ETL), which causes failure of OLED device. Therefore, the effectively packaging the OLED such that its functional layers are separated from water vapor and oxygen in the atmosphere will make the lifetime of the OLED device to be greatly extended. In addition, due to the current demand for flexible OLED, flexible packaging technologies such as thin-film encapsulation technology (TFE) is gradually being sought after.

FIG. 1 is a schematic diagram of a conventional OLED packaging method. As shown in FIG. 1, the OLED packaging method includes: firstly, forming an OLED device 200 on a base substrate 100, and the OLED device 200 includes a TFT layer 210 and an OLED light-emitting layer 220 on the TFT layer 210. Then, forming an inorganic barrier layer 310 that covers the OLED device 200 on the OLED device 200 to improve the waterproof and antioxidant effect of the OLED device 200. Then, manufacturing an organic buffering layer 320 that covers the inorganic buffering layer 310 and the sides of the OLED device 200 in order to release the stress of the inorganic barrier layer 310. The organic buffering layer 320 is generally prepared by an ink jet printing (IJP) method. An ink is uniformly printed on the inorganic barrier layer 310 by a plurality of print heads using an ink jet printing apparatus.

In the flowing process of the ink, due to the poor compatibility of the ink and the inorganic barrier layer 310, the ink in the middle diffuses toward the edge of the inorganic barrier layer 310 based on the fluidity of the liquid, and generating an upward accumulation at the edge of the inorganic barrier layer 310. After the ink is cured, a portion of the organic buffering layer 320 corresponding to the edges of the inorganic barrier layer 310 generates an upward projection 500. Since the upper surface of the organic buffer layer 320 is not flat, when subsequent forming a next inorganic barrier layer on the organic buffering layer 320, the film thickness and morphology of the next inorganic barrier layer is affected, thereby reducing the water and oxygen blocking effect of the inorganic barrier layer.

SUMMARY OF THE INVENTION

The purpose of the present invention is to provide an OLED packaging method, wherein a portion of the organic buffering layer corresponding to the edge position of the inorganic barrier layer does not have an upward projection, and thus the thickness and shape of the inorganic barrier layer formed on the organic buffering layer is not affected. The present invention can increase the barrier effect of inorganic barrier layer for water and oxygen.

Another objective of the present invention is to provide an OLED packaging structure, wherein the upper surface of the organic buffering layer is flat and has a good encapsulation effect.

In order to achieve the above purpose, the present invention provides an OLED packaging method, comprising steps of: step S1: providing a base substrate and forming an OLED device on the base substrate; step S2: forming a first thin-film encapsulation unit on the base substrate and the OLED device, wherein the first thin-film encapsulation unit includes a first inorganic barrier layer that covers an upper surface of the OLED device, and a first organic buffering layer that surrounds the first inorganic barrier layer and the OLED device; the first organic buffering layer includes a ring-shaped organic layer that that covers an edge position of the upper surface of the first inorganic barrier layer and a side surface of the OLED device and a first planar organic layer that covers a region of the upper surface of the first inorganic barrier layer which is surrounded by the first ring-shaped organic layer; the first planar organic layer and the first ring-shaped organic layer are integrated; an upper surface of the first organic buffering layer is flat.

Wherein the number of the OLED devices is one or multiple; the OLED device includes a TFT layer and an OLED light-emitting layer disposed on the TFT layer.

Wherein a material of the first inorganic barrier layer includes one or multiple of silicon nitride (SiNx), silicon carbonitride (SiCxNy) and silicon oxide (SiOx); a material of each of the first ring-shaped organic layer and the first planar organic layer is an organic material.

Wherein the step S2 includes steps of: step S21: forming a first inorganic barrier layer covering the upper surface of the OLED device; step S22: printing an organic material at the edge position of the first inorganic barrier layer, and after curing the organic material, the first ring-shaped organic layer is formed, wherein the first ring-shaped organic layer covers the edge position of the upper surface of the first inorganic barrier layer and the side surface of the OLED device, and forms an embankment structure at the edge position of upper surface of the first inorganic barrier layer; and step S23: printing an organic material on a region of the upper surface of the first inorganic barrier layer surrounded by the first ring-shaped organic layer, and after the organic material is flowed to be smooth, curing the organic material to form the first planar organic layer, the first planar organic layer and the first ring-shaped organic layer are integrated to form a first organic buffering layer, and the upper surface of the first organic buffering layer is flat.

Wherein in the step S21, the method for forming the first inorganic barrier layer includes at least one method of Chemical Vapor Deposition (CVD), Atomic Layer Deposition (ALD), Pulsed Laser Deposition (PLD), and sputtering; in the step S22, an ink jet printer is adopted to print the organic material at the edge position of the first inorganic barrier layer, and the curing method for the organic material is an ultraviolet curing; and in the step S23, an ink jet printer is used to print an organic material on a region of the upper surface of the first inorganic barrier layer surrounded by the first ring-shaped organic layer, and the curing method for the organic material is an ultraviolet curing.

Wherein the method further includes a step S3: forming one or multiple stacked second thin-film encapsulation unit on the first thin-film encapsulation unit, the second thin-film encapsulation unit includes a second inorganic barrier layer and a second organic buffering layer that surrounds the second inorganic barrier layer, the second organic buffering layer includes a second ring-shaped organic layer that covers an edge position of an upper surface of the second inorganic barrier layer and a second planar organic layer that covers on a region of the upper surface of the second inorganic barrier layer surrounded by the second ring-shaped organic layer, the second planar organic layer and the second ring-shaped organic layer are integrated, the upper surface of the second organic buffering layer is flat; the manufacturing process of the second inorganic barrier layer is the same as the first inorganic barrier layer, the manufacturing process of the second ring-shaped organic layer is the same as the first ring-shaped organic layer, the manufacturing process of the second planar organic layer is the same as the first planar organic layer.

The present invention further provides an OLED packaging structure, comprising: a base substrate, an OLED device disposed on the base substrate and a first thin-film encapsulation unit disposed on the base substrate and the OLED device; wherein the first thin-film encapsulation unit includes a first inorganic barrier layer that covers an upper surface of the OLED device, and a first organic buffering layer that surrounds the first inorganic barrier layer and the OLED device; the first organic buffering layer includes a ring-shaped organic layer that that covers an edge position of the upper surface of the first inorganic barrier layer and a side surface of the OLED device and a first planar organic layer that covers a region of the upper surface of the first inorganic barrier layer which is surrounded by the first ring-shaped organic layer; the first planar organic layer and the first ring-shaped organic layer are integrated; an upper surface of the first organic buffering layer is flat.

Wherein the number of the OLED devices is one or multiple; the OLED device includes a TFT layer and an OLED light-emitting layer disposed on the TFT layer.

Wherein a material of the first inorganic barrier layer includes one or multiple of silicon nitride (SiNx), silicon carbonitride (SiCxNy) and silicon oxide (SiOx); a material of each of the first ring-shaped organic layer and the first planar organic layer is an organic material.

Wherein the structures further comprises one or multiple stacked second thin-film encapsulation unit disposed on the first thin-film encapsulation unit, wherein the second thin-film encapsulation unit includes a second inorganic barrier layer and a second organic buffering layer that surrounds the second inorganic barrier layer, the second organic buffering layer includes a second ring-shaped organic layer that covers an edge position of an upper surface of the second inorganic barrier layer and a second planar organic layer that covers on a region of the upper surface of the second inorganic barrier layer surrounded by the second ring-shaped organic layer, the second planar organic layer and the second ring-shaped organic layer are integrated, the upper surface of the second organic buffering layer is flat.

The present invention also provides an OLED packaging method comprising steps of: step S1: providing a base substrate and forming an OLED device on the base substrate; step S2: forming a first thin-film encapsulation unit on the base substrate and the OLED device, wherein the first thin-film encapsulation unit includes a first inorganic barrier layer that covers an upper surface of the OLED device, and a first organic buffering layer that surrounds the first inorganic barrier layer and the OLED device; the first organic buffering layer includes a ring-shaped organic layer that that covers an edge position of the upper surface of the first inorganic barrier layer and a side surface of the OLED device and a first planar organic layer that covers a region of the upper surface of the first inorganic barrier layer which is surrounded by the first ring-shaped organic layer; the first planar organic layer and the first ring-shaped organic layer are integrated; an upper surface of the first organic buffering layer is flat; wherein the number of the OLED devices is one or multiple; the OLED device includes a TFT layer and an OLED light-emitting layer disposed on the TFT layer; wherein a material of the first inorganic barrier layer includes one or multiple of silicon nitride (SiNx), silicon carbonitride (SiCxNy) and silicon oxide (SiOx); a material of each of the first ring-shaped organic layer and the first planar organic layer is an organic material; wherein the step S2 includes steps of: step S21: forming a first inorganic barrier layer covering the upper surface of the OLED device; step S22: printing an organic material at the edge position of the first inorganic barrier layer, and after curing the organic material, the first ring-shaped organic layer is formed, wherein the first ring-shaped organic layer covers the edge position of the upper surface of the first inorganic barrier layer and the side surface of the OLED device, and forms an embankment structure at the edge position of upper surface of the first inorganic barrier layer; and step S23: printing an organic material on a region of the upper surface of the first inorganic barrier layer surrounded by the first ring-shaped organic layer, and after the organic material is flowed to be smooth, curing the organic material to form the first planar organic layer, the first planar organic layer and the first ring-shaped organic layer are integrated to form a first organic buffering layer, and the upper surface of the first organic buffering layer is flat; wherein in the step S21, the method for forming the first inorganic barrier layer includes at least one method of Chemical Vapor Deposition (CVD), Atomic Layer Deposition (ALD), Pulsed Laser Deposition (PLD), and sputtering; in the step S22, an ink jet printer is adopted to print the organic material at the edge position of the first inorganic barrier layer, and the curing method for the organic material is an ultraviolet curing; and in the step S23, an ink jet printer is used to print an organic material on a region of the upper surface of the first inorganic barrier layer surrounded by the first ring-shaped organic layer, and the curing method for the organic material is an ultraviolet curing.

The beneficial effects of the present invention: in the OLED packaging method of the present invention, firstly, forming a ring-shaped organic layer on the edge of the inorganic barrier layer, and then forming a planar organic layer on the upper surface of the inorganic barrier layer surrounded by the ring-shaped organic layer. The planar organic layer and the ring-shaped organic layer are integrated together to form an organic buffering layer covering the inorganic barrier layer. Compared with the organic buffering layer that uses the ink jet printing method to form the organic buffering layer, the upper surface of the organic buffering layer is flat, and the region of the organic buffering layer corresponding to the edge position of the inorganic barrier layer does not have an upward projection, and therefore the film thickness and morphology of the inorganic barrier layer formed over the organic buffer layer are not affected. The present invention can improve the barrier effect of inorganic barrier layer for water and oxygen. The upper surface of the organic buffering layer in the OLED packaging structure of the present invention is flat and has a good encapsulation effect.

In order to further understanding the features and the technology content of the present invention, the following will refer to the embodiments and drawings to describe the present invention in detail. However, the drawings are only used for reference and illustration, not for limiting the present invention.

BRIEF DESCRIPTION OF THE DRAWINGS

Through following to combine figures to describe in detail, the above, the other purposes, the features and benefits of the exemplary embodiment of the present disclosure will become clearer, wherein.

DETAILED DESCRIPTION OF THE PREFERRED EMBODIMENT

In order to further illustrate the technical solution and effects of the present invention, the following content will combine preferred embodiments with accompanying drawings to describe the present invention in detail.

Figure 1:
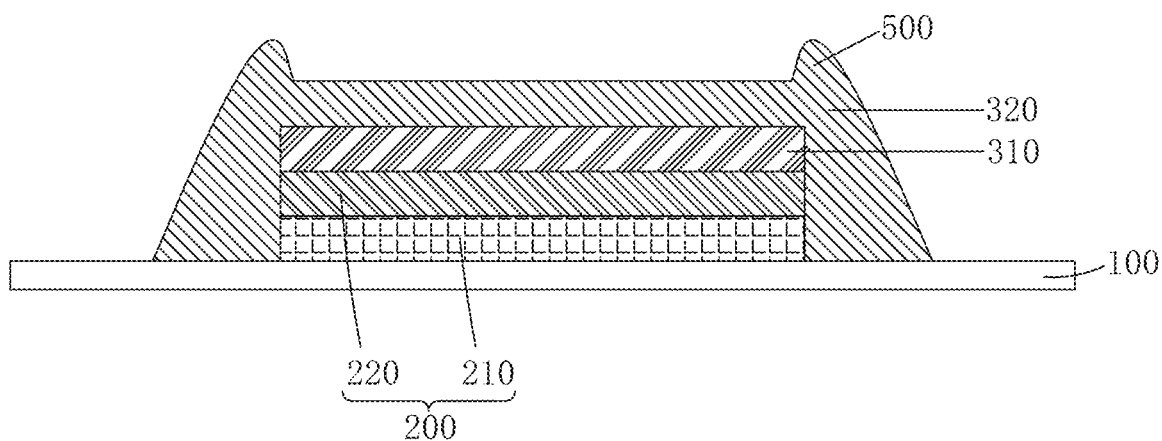
FIG. 1 is a schematic diagram of OLED packaging method of the conventional art.
Figure 2:
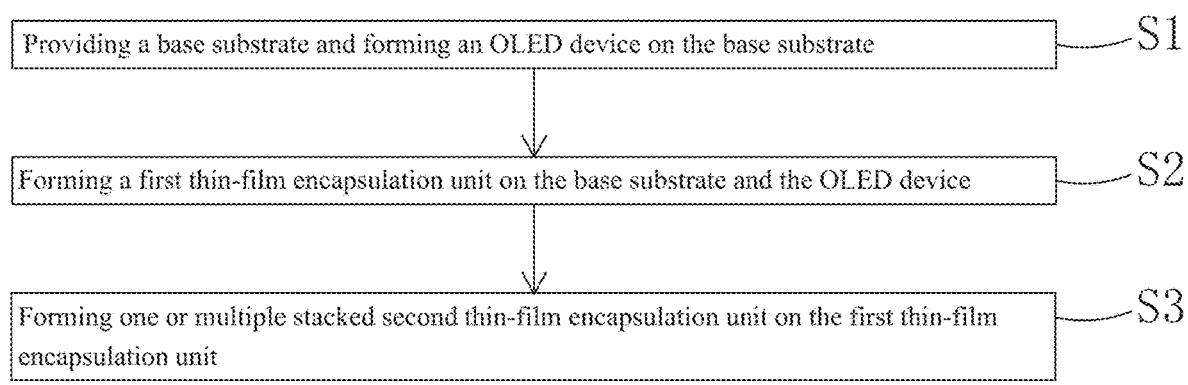
FIG. 2 is a flow chart of an OLED packaging method of the present invention.
Figure 3A:
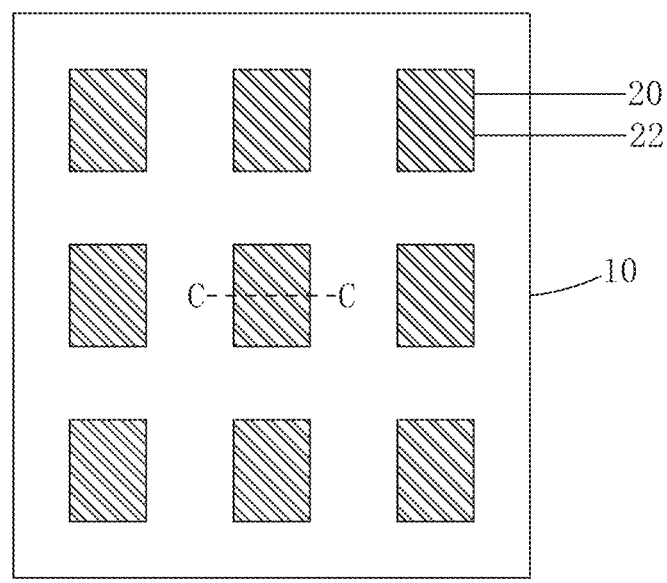
FIG. 3A is a top view of the step S1 for OLED packaging method of the present invention.
Figure 3B:
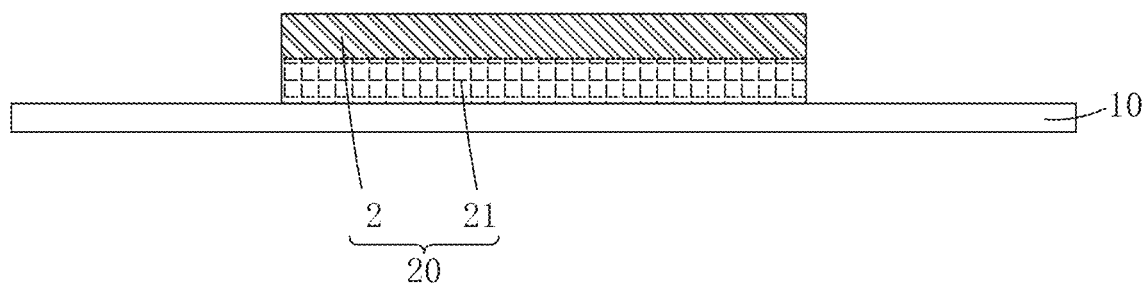
FIG. 3B is a cross-sectional view along C-C line in FIG. 3A.

With reference to FIG. 2, FIG. 2 is an OLED packaging method of the present invention, and the method includes following steps:

Step S1, as shown in FIG. 3A and FIG. 3B, providing a base substrate 10 and forming an OLED device 20 on the base substrate 10.

Specifically, the number of the OLED devices 20 is one or multiple.

Specifically, the OLED device 20 includes a TFT layer 21 and an OLED light-emitting layer 22 disposed on the TFT layer 21.

Step S2, as shown in FIG. 4A to FIG. 6B, forming a first thin-film encapsulation unit 30 on the base substrate 10 and the OLED device 20. The first thin-film encapsulation unit 30 includes a first inorganic barrier layer 31 that covers an upper surface of the OLED device 20, and a first organic buffering layer 32 that surrounds the first inorganic barrier layer 31 and the OLED device 20. The first organic buffering layer 32 includes a ring-shaped organic layer 321 that that covers an edge position of the upper surface of the first inorganic barrier layer 31 and a side surface of the OLED device 20, and a first planar organic layer 322 that covers a region of the upper surface of the first inorganic barrier layer 31 which is surrounded by the first ring-shaped organic layer 321; the first planar organic layer 322 and the first ring-shaped organic layer 321 are integrated; an upper surface of the first organic buffering layer 32 is flat.

Specifically, a material of the first inorganic barrier layer 31 includes one or multiple of silicon nitride (SiNx), silicon carbonitride (SiCxNy) and silicon oxide (SiOx).

Specifically, a material each of the first ring-shaped organic layer 321 and the first planar organic layer 322 is an organic material.

Compared to the prior art, a portion of the first organic buffering layer 32 corresponding to a region of edge position of the first inorganic barrier layer 31 does not have an upward projection.

Figure 4A:
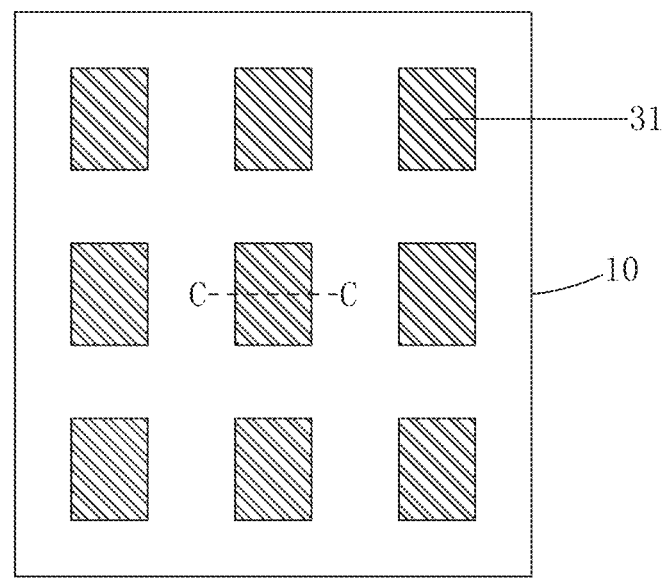
FIG. 4A is a top view of the step S21 for OLED packaging method of the present invention.
Figure 4B:
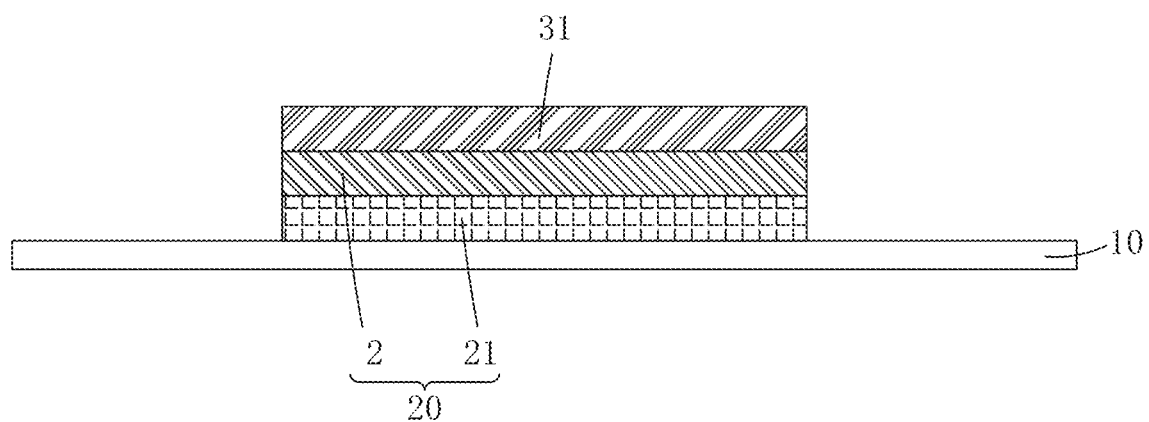
FIG. 4B is a cross-sectional view along C-C line in FIG. 4A.

The step S2 specifically includes the following steps:

Step S21, as shown in FIGS. 4A and 4B, forming a first inorganic barrier layer 31 covering the upper surface of the OLED device 20 on the OLED device 20.

Specifically, the method for forming the first inorganic barrier layer 31 includes at least one method of Chemical Vapor Deposition (CVD), Atomic Layer Deposition (ALD), Pulsed Laser Deposition (PLD), and sputtering.

Figure 5A:
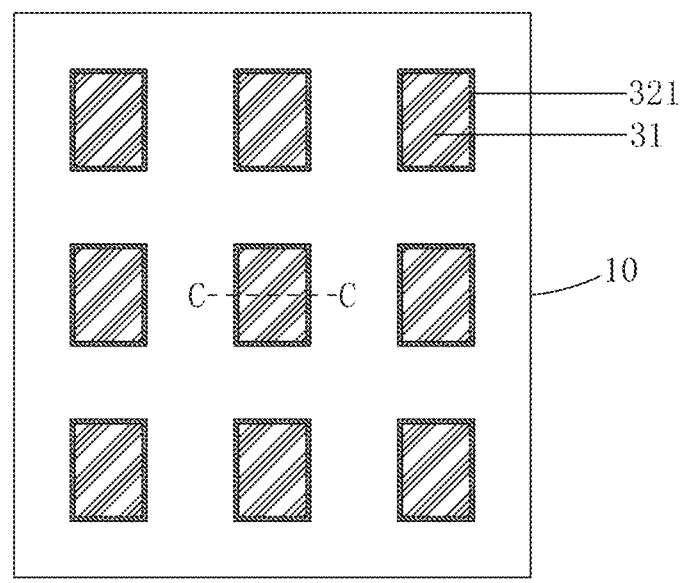
FIG. 5A is a top view of the step S22 for OLED packaging method of the present invention.
Figure 5B:
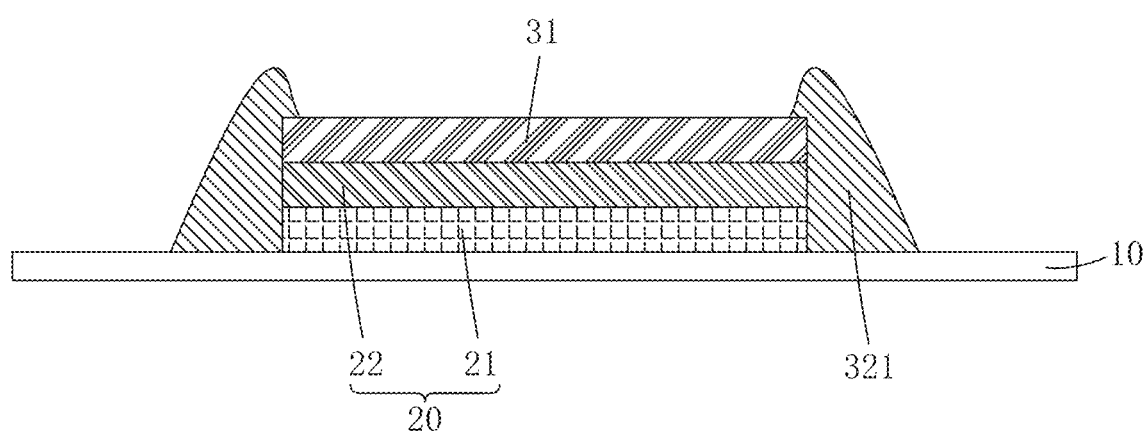
FIG. 5B is a cross-sectional view along C-C line in FIG. 5A.

In step S22, as shown in FIG. 5A and FIG. 5B, printing an organic material at the edge position of the first inorganic barrier layer 31, and after curing the organic material, the first ring-shaped organic layer 321 is formed. Wherein, the first ring-shaped organic layer 321 covers the edge position of the upper surface of the first inorganic barrier layer 31 and the side surface of the OLED device 20, and forms an embankment structure at the edge position of upper surface of the first inorganic barrier layer 31.

Specifically, in the step S22, an ink jet printer is adopted to print an organic material at the edge position of the first inorganic barrier layer 31. The curing method for the organic material is an ultraviolet curing.

Specifically, in the step S22, a micro-UV curing device is adopted to rapidly cure the organic material in order to form the first ring-shaped organic layer 321.

Figure 6A:
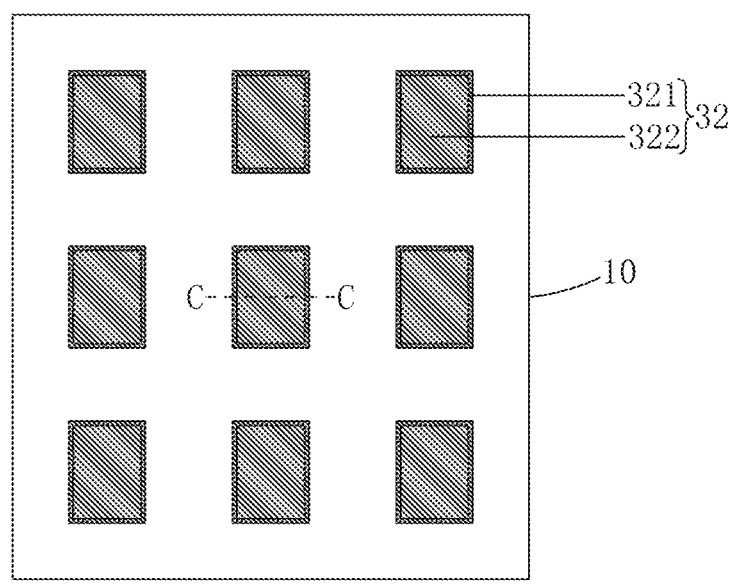
FIG. 6A is a top view of the step S23 for OLED packaging method of the present invention and a first embodiment of OLED packaging structure of the present invention.
Figure 6B:
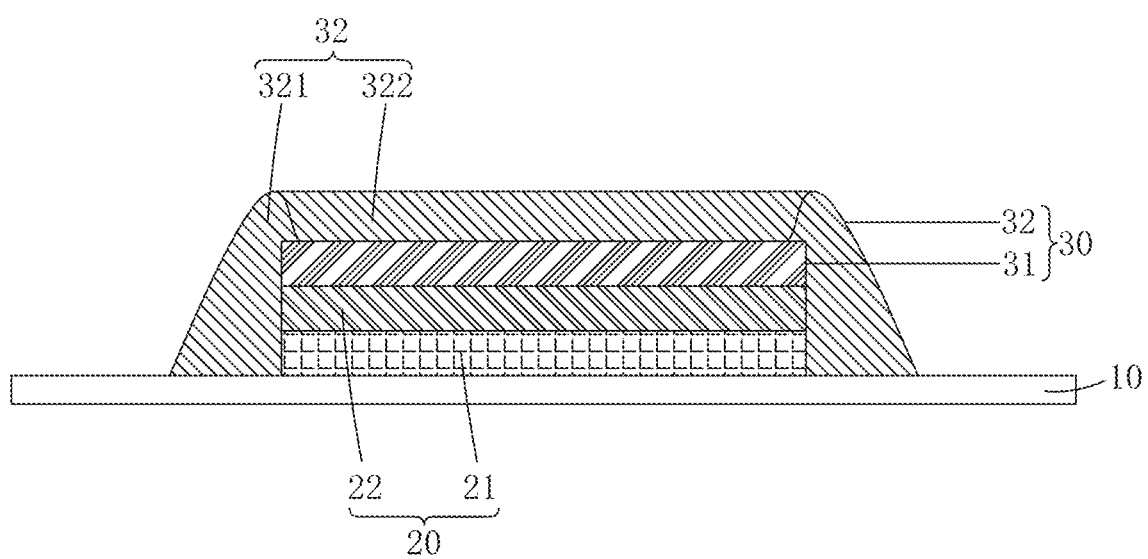
FIG. 6B is a cross-sectional view along C-C line in FIG. 6A and a cross-sectional view of the first embodiment of OLED packaging structure.

In step S23, as shown in FIG. 6A and FIG. 6B, printing an organic material on a region of the upper surface of the first inorganic barrier layer 31 surrounded by the first ring-shaped organic layer 321, and after the organic material is flowed to be smooth, curing the organic material to form the first planar organic layer 322. The first planar organic layer 322 and the first ring-shaped organic layer 321 are integrated to form a first organic buffering layer 32, and the upper surface of the first organic buffering layer 32 is flat.

Specifically, in the step S23, an ink jet printer is used to print an organic material on a region of the upper surface of the first inorganic barrier layer 31 surrounded by the first ring-shaped organic layer 321, and the curing method for the organic material is an ultraviolet curing.

Figure 7A:
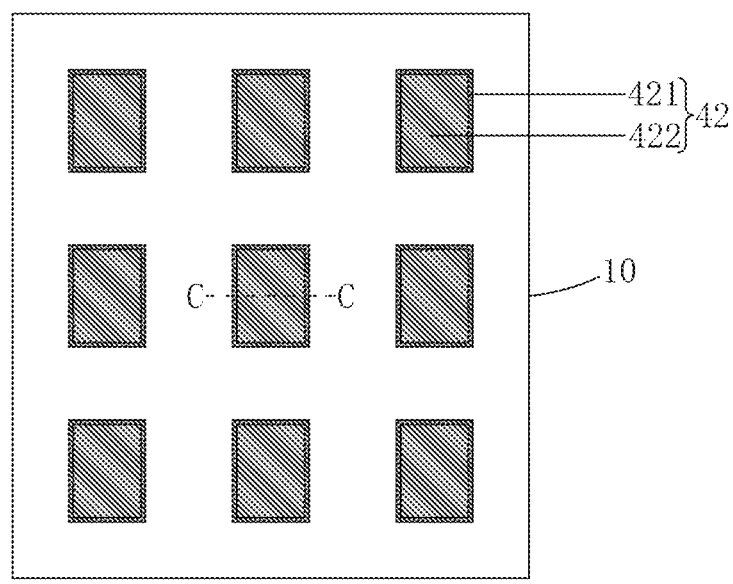
FIG. 7A is a top view of the step S3 for OLED packaging method of the present invention and a second embodiment of OLED packaging structure of the present invention.
Figure 7B:
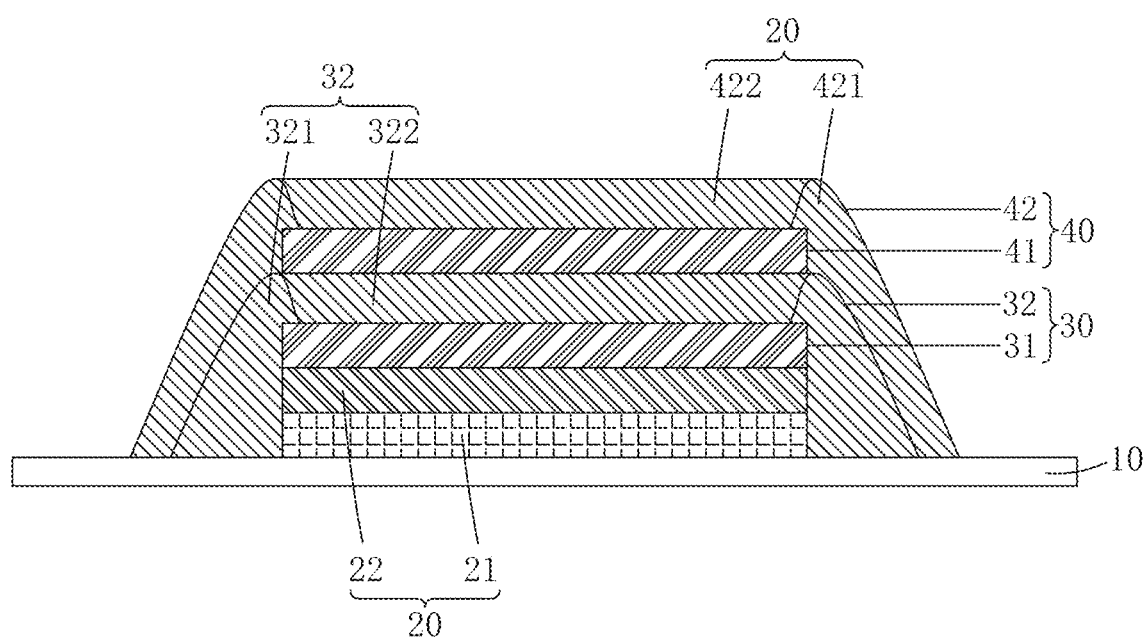
FIG. 7B is a cross-sectional view along C-C line in FIG. 7A and a cross-sectional view of the second embodiment of OLED packaging structure.

Optionally, the OLED packaging method further includes a step S3. As shown in FIG. 7A and FIG. 7B, forming one or multiple stacked second thin-film encapsulation unit 40 on the first thin-film encapsulation unit 30. The second thin-film encapsulation unit 40 includes a second inorganic barrier layer 41 and a second organic buffering layer 42 that surrounds the second inorganic barrier layer 41. The second organic buffering layer 42 includes a second ring-shaped organic layer 421 that covers an edge position of an upper surface of the second inorganic barrier layer 41 and a second planar organic layer 422 that covers on a region of the upper surface of the second inorganic barrier layer 41 surrounded by the second ring-shaped organic layer 421. The second planar organic layer 422 and the second ring-shaped organic layer 421 are integrated. The upper surface of the second organic buffering layer 42 is flat, The manufacturing process of the second inorganic barrier layer 41 is the same as the first inorganic barrier layer 31. The manufacturing process of the second ring-shaped organic layer 421 is the same as the first ring-shaped organic layer 321. The manufacturing process of the second planar organic layer 422 is the same as the first planar organic layer 322.

Specifically, a material of the second inorganic barrier layer 41 includes one or more of silicon nitride (SiNx), silicon carbonitride (SiCxNy), and silicon oxide (SiOx).

Specifically, the materials of the second ring-shaped organic layer 421 and the second planar organic layer 422 are both organic materials.

Specifically, the first inorganic barrier layer 31 and the second inorganic barrier layer 41 can isolate the OLED device 20 from water and oxygen, and improve the isolation effect of water and oxygen for the OLED device 20.

Specifically, the first organic buffering layer 32 and the second organic buffering layer 42 can release the stress of the first inorganic barrier layer 31 and the second inorganic barrier layer 41, improve the flexibility of the thin-film encapsulation structure layer, and can cover the particles on the first inorganic barrier layer 31 and the second inorganic barrier layer 41 so as to improve the flatness of the thin-film encapsulation structure layer.

In the OLED packaging method of the present invention, firstly, forming a ring-shaped organic layer on the edge of the inorganic barrier layer, and then forming a planar organic layer on the upper surface of the inorganic barrier layer surrounded by the ring-shaped organic layer. The planar organic layer and the ring-shaped organic layer are integrated together to form an organic buffering layer covering the inorganic barrier layer. Compared with the organic buffering layer that uses the ink jet printing method to form the organic buffering layer, the upper surface of the organic buffering layer is flat, and the region of the organic buffering layer corresponding to the edge position of the inorganic barrier layer does not have an upward projection, and therefore the film thickness and morphology of the inorganic barrier layer formed over the organic buffer layer are not affected. The present invention can improve the barrier effect of inorganic barrier layer for water and oxygen. The upper surface of the organic buffering layer in the OLED packaging structure of the present invention is flat and has a good encapsulation effect.

With reference to FIG. 6A and FIG. 6B, based on the above OLED packaging method, the present invention provides a first embodiment of an OLED packaging structure, including: a base substrate 10, an OLED device 20 disposed on the base substrate 10, and a first thin-film encapsulation unit 30 that covers the OLED device 20.

Wherein the first thin-film encapsulation unit 30 includes a first inorganic barrier layer 31 that covers an upper surface of the OLED device 20, and a first organic buffering layer 32 that surrounds the first inorganic barrier layer 31 and the OLED device 20; the first organic buffering layer 32 includes a ring-shaped organic layer 321 that that covers an edge position of the upper surface of the first inorganic barrier layer 31 and a side surface of the OLED device 20 and a first planar organic layer 322 that covers a region of the upper surface of the first inorganic barrier layer 31 which is surrounded by the first ring-shaped organic layer 321; the first planar organic layer 322 and the first ring-shaped organic layer 321 are integrated together; an upper surface of the first organic buffering layer 32 is flat.

Specifically, the number of the OLED devices 20 is one or multiple.

Specifically, the OLED device includes a TFT layer 21 and an OLED light-emitting layer 22 disposed on the TFT layer 21.

Specifically, a material of the first inorganic barrier layer 31 includes one or multiple of silicon nitride (SiNx), silicon carbonitride (SiCxNy) and silicon oxide (SiOx).

Specifically, a material of each of the first ring-shaped organic layer and the first planar organic layer is an organic material With reference to FIG. 7A and FIG. 7B, the present invention provides a second embodiment of an OLED packaging structure, comparing with the OLED packaging structure of the first embodiment, the second embodiment of an OLED packaging structure further includes one or multiple stacked second thin-film encapsulation unit 40 on the first thin-film encapsulation unit 30. The second thin-film encapsulation unit 40 includes a second inorganic barrier layer 41 and a second organic buffering layer 42 that surrounds the second inorganic barrier layer 41. The second organic buffering layer 42 includes a second ring-shaped organic layer 421 that covers an edge position of an upper surface of the second inorganic barrier layer 41 and a second planar organic layer 422 that covers on a region of the upper surface of the second inorganic barrier layer 41 surrounded by the second ring-shaped organic layer 421. The second planar organic layer 422 and the second ring-shaped organic layer 421 are integrated, The upper surface of the second organic buffering layer 42 is flat.

Specifically, a material of the second inorganic barrier layer 41 includes one or multiple of silicon nitride (SiNx), silicon carbonitride (SiCxNy) and silicon oxide (SiOx).

Specifically, a material of each of the second ring-shaped organic layer 421 and the second planar organic layer is an organic material.

The upper surface of the organic buffering layer in the above OLED packaging structure is flat, and having a better packaging effect.

In summary, in the OLED packaging method of the present invention, firstly, forming a ring-shaped organic layer on the edge of the inorganic barrier layer, and then forming a planar organic layer on the upper surface of the inorganic barrier layer surrounded by the ring-shaped organic layer. The planar organic layer and the ring-shaped organic layer are integrated together to form an organic buffering layer covering the inorganic barrier layer. Compared with the organic buffering layer that uses the ink jet printing method to form the organic buffering layer, the upper surface of the organic buffering layer is flat, and the region of the organic buffering layer corresponding to the edge position of the inorganic barrier layer does not have an upward projection, and therefore the film thickness and morphology of the inorganic barrier layer formed over the organic buffer layer are not affected. The present invention can improve the barrier effect of inorganic barrier layer for water and oxygen. The upper surface of the organic buffering layer in the OLED packaging structure of the present invention is flat and has a good encapsulation effect.

The above embodiments of the present invention provide an illustration for a digital control driving method, a driving display device and a display device in detail. Specific examples are used herein to describe the principle and implementation manner of the present invention. The above embodiments are only used to help understanding the method and the core idea of the present invention; at the same time, for those skilled in the art, according to the present invention, the embodiments of the present invention will have changes in specific implementation manners and application ranges. In summary, the contents of this specification should not be construed as limiting the present invention.

What is claimed is:

1. An OLED packaging method comprising steps of:
   step S1: providing a base substrate and forming an OLED device on the base substrate;
   step S2: forming a first thin-film encapsulation unit on the base substrate and the OLED device, wherein the first thin-film encapsulation unit includes a first inorganic barrier layer that covers an upper surface of the OLED device, and a first organic buffering layer that surrounds the first inorganic barrier layer and the OLED device; the first organic buffering layer includes a ring-shaped organic layer that that covers an edge position of the upper surface of the first inorganic barrier layer and a side surface of the OLED device and a first planar organic layer that covers a region of the upper surface of the first inorganic barrier layer which is surrounded by the first ring-shaped organic layer; the first planar organic layer and the first ring-shaped organic layer are integrated together; an upper surface of the first organic buffering layer is flat;
   wherein the step S2 includes steps of:
   step S21: forming a first inorganic barrier layer covering the upper surface of the OLED device;
   step S22: printing an organic material at the edge position of the first inorganic barrier layer, and after curing the organic material, the first ring-shaped organic layer is formed, wherein the first ring-shaped organic layer covers the edge position of the upper surface of the first inorganic barrier layer and the side surface of the OLED device, and forms an embankment structure at the edge position of upper surface of the first inorganic barrier layer; and
   step S23: printing an organic material on a region of the upper surface of the first inorganic barrier layer surrounded by the first ring-shaped organic layer, and after the organic material is flowed to be smooth, curing the organic material to form the first planar organic layer, the first planar organic layer and the first ring-shaped organic layer are integrated together to form a first organic buffering layer, and the upper surface of the first organic buffering layer is flat.

2. The OLED packaging method according to claim 1, wherein the number of the OLED devices is one or multiple; the OLED device includes a TFT layer and an OLED light-emitting layer disposed on the TFT layer.

3. The OLED packaging method according to claim 1, wherein a material of the first inorganic barrier layer includes one or multiple of silicon nitride (SiNx), silicon carbonitride (SiCxNy) and silicon oxide (SiOx); a material of each of the first ring-shaped organic layer and the first planar organic layer is an organic material.

4. The OLED packaging method according to claim 1, wherein in the step S21, the method for forming the first inorganic barrier layer includes at least one method of Chemical Vapor Deposition (CVD), Atomic Layer Deposition (ALD), Pulsed Laser Deposition (PLD), and sputtering;
   in the step S22, an ink jet printer is adopted to print the organic material at the edge position of the first inorganic barrier layer, and the curing method for the organic material is an ultraviolet curing; and
   in the step S23, an ink jet printer is used to print an organic material on a region of the upper surface of the first inorganic barrier layer surrounded by the first ring-shaped organic layer, and the curing method for the organic material is an ultraviolet curing.

5. The OLED packaging method according to claim 1, wherein the method further includes a step S3: forming one or multiple stacked second thin-film encapsulation unit on the first thin-film encapsulation unit, the second thin-film encapsulation unit includes a second inorganic barrier layer and a second organic buffering layer that surrounds the second inorganic barrier layer, the second organic buffering layer includes a second ring-shaped organic layer that covers an edge position of an upper surface of the second inorganic barrier layer and a second planar organic layer that covers on a region of the upper surface of the second inorganic barrier layer surrounded by the second ring-shaped organic layer, the second planar organic layer and the second ring-shaped organic layer are integrated together, the upper surface of the second organic buffering layer is flat;
   the manufacturing process of the second inorganic barrier layer is the same as the first inorganic barrier layer, the manufacturing process of the second ring-shaped organic layer is the same as the first ring-shaped organic layer, and the manufacturing process of the second planar organic layer is the same as the first planar organic layer.

6. An OLED packaging method comprising steps of:
   step S1: providing a base substrate and forming an OLED device on the base substrate;
   step S2: forming a first thin-film encapsulation unit on the base substrate and the OLED device, wherein the first thin-film encapsulation unit includes a first inorganic barrier layer that covers an upper surface of the OLED device, and a first organic buffering layer that surrounds the first inorganic barrier layer and the OLED device; the first organic buffering layer includes a ring-shaped organic layer that that covers an edge position of the upper surface of the first inorganic barrier layer and a side surface of the OLED device and a first planar organic layer that covers a region of the upper surface of the first inorganic barrier layer which is surrounded by the first ring-shaped organic layer; the first planar organic layer and the first ring-shaped organic layer are integrated together; an upper surface of the first organic buffering layer is flat;

wherein the number of the OLED devices is one or multiple; the OLED device includes a TFT layer and an OLED light-emitting layer disposed on the TFT layer;

wherein a material of the first inorganic barrier layer includes one or multiple of silicon nitride (SiNx), silicon carbonitride (SiCxNy) and silicon oxide (SiOx); a material of each of the first ring-shaped organic layer and the first planar organic layer is an organic material;

wherein the step S2 includes steps of:

step S21: forming a first inorganic barrier layer covering the upper surface of the OLED device;

step S22: printing an organic material at the edge position of the first inorganic barrier layer, and after curing the organic material, the first ring-shaped organic layer is formed, wherein the first ring-shaped organic layer covers the edge position of the upper surface of the first inorganic barrier layer and the side surface of the OLED device, and forms an embankment structure at the edge position of upper surface of the first inorganic barrier layer; and step S23: printing an organic material on a region of the upper surface of the first inorganic barrier layer surrounded by the first ring-shaped organic layer, and after the organic material is flowed to be smooth, curing the organic material to form the first planar organic layer, the first planar organic layer and the first ring-shaped organic layer are integrated together to form a first organic buffering layer, and the upper surface of the first organic buffering layer is flat;

wherein in the step S21, the method for forming the first inorganic barrier layer includes at least one method of Chemical Vapor Deposition (CVD), Atomic Layer Deposition (ALD), Pulsed Laser Deposition (PLD), and sputtering;

in the step S22, an ink jet printer is adopted to print the organic material at the edge position of the first inorganic barrier layer, and the curing method for the organic material is an ultraviolet curing; and in the step S23, an ink jet printer is used to print an organic material on a region of the upper surface of the first inorganic barrier layer surrounded by the first ring-shaped organic layer, and the curing method for the organic material is an ultraviolet curing.

7. The OLED packaging method according to claim 6, wherein the method further includes a step S3: forming one or multiple stacked second thin-film encapsulation unit 40 on the first thin-film encapsulation unit, the second thin-film encapsulation unit includes a second inorganic barrier layer and a second organic buffering layer that surrounds the second inorganic barrier layer, the second organic buffering layer includes a second ring-shaped organic layer that covers an edge position of an upper surface of the second inorganic barrier layer and a second planar organic layer that covers on a region of the upper surface of the second inorganic barrier layer surrounded by the second ring-shaped organic layer, the second planar organic layer and the second ring-shaped organic layer are integrated together, the upper surface of the second organic buffering layer is flat;

the manufacturing process of the second inorganic barrier layer is the same as the first inorganic barrier layer, the manufacturing process of the second ring-shaped organic layer is the same as the first ring-shaped organic layer, and the manufacturing process of the second planar organic layer is the same as the first planar organic layer.

* * * * *